United States Patent
Spuler et al.

(10) Patent No.: US 10,794,998 B2
(45) Date of Patent: Oct. 6, 2020

(54) DIODE LASER BASED HIGH SPECTRAL RESOLUTION LIDAR

(71) Applicants: University Corporation for Atmospheric Research, Boulder, CO (US); Wisconsin Alumni Research Foundation, Madison, WI (US)

(72) Inventors: Scott Spuler, Westminster, CO (US); Matthew Hayman, Boulder, CO (US); Bruce Morley, Boulder, CO (US); Edwin W. Eloranta, Mount Horeb, WI (US)

(73) Assignees: University Corporation for Atmospheric Research, Boulder, CO (US); Wisconsin Alumni Research Foundation, Madison, WI (US)

( * ) Notice: Subject to any disclaimer, the term of this patent is extended or adjusted under 35 U.S.C. 154(b) by 1303 days.

(21) Appl. No.: 15/090,063

(22) Filed: Apr. 4, 2016

(65) Prior Publication Data

US 2017/0212218 A1    Jul. 27, 2017

Related U.S. Application Data

(60) Provisional application No. 62/186,073, filed on Jun. 29, 2015.

(51) Int. Cl.
*G01C 3/08* (2006.01)
*G01S 7/48* (2006.01)
(Continued)

(52) U.S. Cl.
CPC ............ *G01S 7/4802* (2013.01); *G01S 7/484* (2013.01); *G01S 7/4812* (2013.01);
(Continued)

(58) Field of Classification Search
CPC ........ G01S 7/4802; G01S 17/95; G01S 7/484; G01S 7/4816; G01S 7/4814;
(Continued)

(56) References Cited

U.S. PATENT DOCUMENTS 5,583,342 A * 12/1996 Ichie .................. G02B 5/001
                                                      250/458.1
6,252,701 B1 * 6/2001 Kanda ................ H01S 3/06754
                                                      359/337.21

(Continued)

OTHER PUBLICATIONS

Yanning Durand, Jerome Caron, Jean-Loup Bezy, Roland Meynart, Lidar Technology pre-developments in support of A-SCOPE, the ESA mission to measure CO2 from space, European Space Agency, CLRC XV—Toulouse, Jun. 22-26, 2009.

(Continued)

*Primary Examiner* — Samantha K Abraham
(74) *Attorney, Agent, or Firm* — The Ollila Law Group LLC

(57) ABSTRACT

Lidar is an acronym for Light Detection And Ranging. The technology may be used to measure distance by illuminating a target with a laser beam and performing analysis on the reflected laser beam light. In the atmospheric sciences, Lidar may be used to study the optical depth of clouds, the impact of aerosols on clouds, and the interactions between aerosols and clouds on the climate. The present application proposes a lidar-based technology using a diode laser (101) beam sent through a tapered semiconductor optical amplifier (106) and an axicon pair expander (108) wherein the laser light may be transmitted through a telescope (110) at an object to be studied. Upon striking the object to be studied, the laser (101) is reflected and recovered by the telescope (110). The reflected laser is then sent through a heated rubidium vapor cell (115) and a total detection channel (116) for analysis.

17 Claims, 1 Drawing Sheet

(51) Int. Cl.
*H01S 5/0687* (2006.01)
*G02B 27/12* (2006.01)
*G02B 27/09* (2006.01)
*G01S 7/499* (2006.01)
*G01S 17/95* (2006.01)
*G01S 7/484* (2006.01)
*G01S 7/481* (2006.01)
*H01S 5/00* (2006.01)
*H01S 5/125* (2006.01)
*H01S 5/50* (2006.01)

(52) U.S. Cl.
CPC .......... *G01S 7/4814* (2013.01); *G01S 7/4816* (2013.01); *G01S 7/499* (2013.01); *G01S 17/95* (2013.01); *G02B 27/0972* (2013.01); *G02B 27/126* (2013.01); *H01S 5/0687* (2013.01); *H01S 5/0064* (2013.01); *H01S 5/125* (2013.01); *H01S 5/50* (2013.01); *Y02A 90/19* (2018.01)

(58) Field of Classification Search
CPC ... G01S 7/4812; G01S 7/499; G02B 27/0972; G02B 27/126; H01S 5/0687; H01S 5/50; H01S 5/125; H01S 5/0064; Y02A 90/19
See application file for complete search history.

(56) References Cited

U.S. PATENT DOCUMENTS

| | | | |
|---|---|---|---|
| 2004/0022291 A1* | 2/2004 | Das ................... | G02B 26/0816 372/55 |
| 2007/0153839 A1 | 7/2007 | Varming et al. | |
| 2007/0279615 A1* | 12/2007 | Degnan ................... | G01S 7/499 356/4.01 |
| 2010/0171944 A1* | 7/2010 | Langdon ................... | G01P 5/26 356/28.5 |
| 2010/0277714 A1* | 11/2010 | Pedersen ............... | G01S 7/4811 356/28 |
| 2012/0274937 A1* | 11/2012 | Hays ....................... | G01S 17/58 356/337 |
| 2014/0376575 A1* | 12/2014 | Kono .................... | H01S 3/2308 372/18 |
| 2015/0015869 A1* | 1/2015 | Smith .................... | G01S 17/023 356/28.5 |

OTHER PUBLICATIONS

Fabien Gibert, Dimitri Edouart, Claire Cenac, Florian Le Mounier, Pierre Flamant, Advanced 2um Ho :YLF trnsmitter and coherent DIAL for atmospheric CO2 profiling in the boundary layer, LMD/CNRS, Ecole Polytechnique, Palaiseau, France.

Sameh Abdelazim, David Santoro, Mark Arend, Fred Moshary, Sam Ahmed, Development of All-fiber coherent Doppler LIDAR system for wind sensing, Electrical Engineering Department, city college of New York, New York, NY 10031 USA.

F. Gibert, D. Edouart, C. Cenac, F. Le Mounier, A. Dumas, New Advances i 2-uM High-Power Dual-Frequency Single-Mode Q-Switched HO:YLF Laser for Dial and IPDA applications, LMD-CNRS, Ecole Polytechnique, 91128 Palaiseau cedex, France.

Timothy S. McComb, R. Andrew Sims, Christina C. C. Willis, Pankaj Kadwani, Vikas Sudesh, Lawrence Shah, and Martin Richardson, High-power widely tunable thulium fiber lasers, Townes Laser Intitute, CREOL, University of central Florida, 4000 central Florida Bouledvard, Orlando, Florida 32816, USA . . . , revised Oct. 4, 2010; accepted Oct. 9, 2010; posted Oct. 11, 2010 (Doc. ID 132948); published Nov. 3, 2010.

Guillaume Canat, Julien Le Gouet, Laurent Lombard, Alexandre Bresson, Didier Goular, Agnes Dolfi-Bouteyre, Sophie Suzeller, Denis Boivin, Johan Nilsson, Jayata Sahu, Sylvain Bordais, High Power Pulsed Fiber Laser Development for CO2 Space Based Dial System, Onera, The French Aerospace Lab, Chemin de la Huniere 91761 Palaiseau, France, Optoelectronics Research Center, University of Southampton, United Kingdom, Keopsys, 2 rue Paul Sabatier; 22300 Lannion France.

Haiyun Xia, Guoliang Shentu, Mingjia Shangguan, Xiuxiu Xia, Xiaodong Jia, Chong Wang, Jun Zhang, Qiang Zzhang, Xiankang Dou, and Jianwei Pan, Long-range micro-pulse aerosol lidar at 1.5um with an up-conversion single-photon detector, School of Earth and Space Sciences, University of Science and Technology of china, Hefi, 230025, China . . . .

* cited by examiner

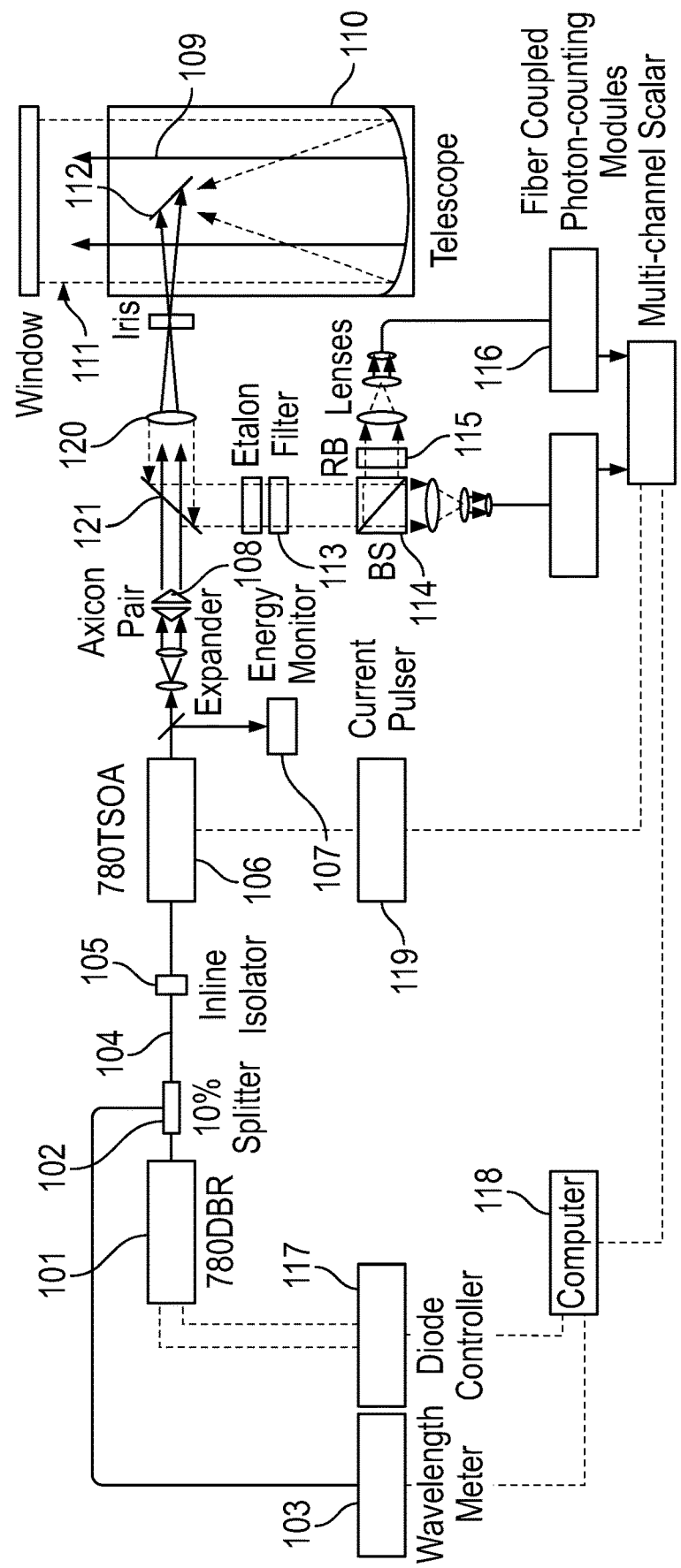

DIODE LASER BASED HIGH SPECTRAL RESOLUTION LIDAR

CROSS-REFERENCE TO RELATED APPLICATION

This application claims priority from U.S. Provisional Patent Application No. 62/186,073, filed Jun. 29, 2015, entitled "Diode-Laser-Based High Spectral Resolution Lidar (DLB-HSRL)".

GOVERNMENT LICENSE RIGHTS

The U.S. Government has a paid-up license in this invention and the right in limited circumstances to require the patent owner to license others on reasonable terms as provided for by the terms of Agreement No. AGS-0753581, awarded by a National Science Foundation and National Center for Atmospheric Research cooperative agreement.

TECHNICAL FIELD

The present application is related to the field of remote sensing, and in particular, to the study of cloud and aerosol interactions in climate atmospheric research.

BACKGROUND OF THE INVENTION

Lidar is an acronym for Light Detection And Ranging. In the atmospheric sciences, it is a technology that may be used to measure range resolved atmospheric constituents such as wind, aerosol particles, water vapor, and others. Lidar measurements may be used in the study of cloud and aerosol interactions and their influence on the climate. Several lidar based technologies are currently used in the climate study field.

Networks of autonomous low-power, or micropulse lidars, for example MPLNet hereinafter referred to as MPL, use elastic backscatter for cloud and aerosol observation. This technology is capable of supplying qualitative observational data, but does not provide accurate quantitative data. The MPL performs two backscatter-polarization measurements, with three unknowns of polarization, backscatter and extinction. Similarly, Vaisala ceilometers perform backscatter measurements with one measurement and two unknowns (backscatter and extinction) so the two atmospheric optical parameters cannot be retrieved. This requires making certain a priori assumptions regarding the relationship between backscatter and extinction in order for atmospheric optical parameters to be determined.

Raman lidar is currently used to provide quantitative atmospheric backscatter and extinction by measuring the Raman shifted backscatter intensity of nitrogen in the atmosphere. The total backscatter and molecular backscatter measurement are used to determine calibrated backscatter and extinction. The backscatter of molecules is relatively stable and provides an optical constant employed to compare total backscattered signals. The backscatter coefficient of the target volume can be determined and deviations in the expected molecular backscatter from that actually measured provide atmospheric extinction or transmission data. Raman scattering is several orders of magnitude weaker than elastic backscatter Implementation of Raman lidar instruments therefore require powerful lasers, which, in turn are poorly suited network operation since these are generally expensive, require cooling, may not produce an eye-safe beam, and require routine maintenance such as flash lamp changes and cavity alignment.

Lidar systems that rely on elastic backscatter signals, allow the laser pulse energy to be significantly reduced, and are simpler to make into an eye-safe system. To make a quantitative measurement of aerosol properties with an elastic backscatter lidar the high spectral resolution lidar (HSRL) technique can be used. The elastic backscatter from molecules is significantly spectrally broadened compared to elastic backscatter from aerosols and clouds. The molecular backscatter can be separated from the aerosol/cloud backscatter by using a narrow band filter to block the spectrally narrow cloud and aerosol backscatter, only allowing the wings of the much broader molecular backscatter to pass. Some HSRL systems have relied on etalons to create these narrow spectral filters but they only offer a limited optical depth and restrict the etendu of the receiver system.

Etendue is defined as a property of light in an optical system, which characterizes how "spread out" the light is in area and angle. Etendue never decreases in any optical system and a perfect optical system produces an image with the same etendue as the source.

Iodine absorption cells have been used as spectral filters for frequency doubled Nd:YAG lasers operating at 532 nm, but finding lasers that are small, low maintenance and operate with sufficiently narrow line widths at 532 nm presents a significant cost and reliability challenge.

What is needed is a network of deployable cloud aerosol lidars that are low-cost, eye-safe, reliable enough to run continuously for years without maintenance, and must provide both qualitative and quantitative optical data without applying a priori assumptions.

A potential solution is to develop a diode-laser-based high-spectral-resolution-lidar (DLB-HSRL.) This option requires sufficient transmit power, proper wavelength, system reliability, component reliability and a low enough cost in order to make remote network deployment a practical option. However, to achieve the improved data products over existing commercial systems, the DLB-HSRL needs lasers with stable and narrow line-widths and a matching receiver filter with similarly narrow rejection spectra but high optical depth. This must be accomplished without significantly increasing the cost, size, or maintenance requirements of the system.

SUMMARY OF THE INVENTION

The present application is designed to improve understanding of clouds and aerosols by providing quantitative data products. The present application describes a diode laser-based high spectral resolution lidar (DLB-HSRL) featuring low power consumption and electrically pumped semiconductor transmitters capable of operation for tens of thousands of hours without the requirement for water cooling. A benefit is lower operation and maintenance costs when compared to traditional quantitative lidar systems. The DLB-HSRL provides data products similar to current Raman lidar and HSRL systems but at a cost, size and complexity competitive with current commercial non-quantitative elastic backscatter lidar systems.

ASPECTS OF THE INVENTION

In one aspect of the invention, a diode laser based high spectral resolution lidar comprises:

a diode laser emitting a laser beam, a splitter which separates the laser beam, an inline fiber isolator and a tapered semiconductor optical amplifier which receives a portion of the laser beam and amplifies it into pulses which are transmitted.

Preferably the device further comprises:

a telescope to receive reflected laser light, an interference filter to receive the reflected laser light and filter the reflected laser light, a narrow band etalon to receive the filtered reflected laser light and reduce background light, a beam splitter for splitting the reduced background light into a first portion and a second portion, a total detection channel which receives at least one of the first portion of the reduced background light and the combined molecular collected backscatter and the aerosol and cloud collected backscatter, a heated rubidium vapor cell which receives the second portion of the reduced background light and blocks a spectrally narrow cloud and aerosol collected backscatter and passes wings of molecular collected backscatter, a molecular channel detector for receiving the wings of molecular signal.

Preferably the laser uses at least one of a distributed Bragg reflector (DBR), or a distributed feedback (DFB) laser.

Preferably the laser has a wavelength of approximately 780 nanometers.

Preferably the laser beam is split into a portion that is received by the inline fiber isolator and the tapered semiconductor optical amplifier which receives a portion of the laser beam.

Preferably the portion of the laser beam not received by the inline fiber isolator and the tapered semiconductor optical amplifier is sampled and directed to at least one of a wavelength meter or a device for monitoring and controlling the wavelength of the laser.

Preferably the total detection channel further comprises a depolarization channel.

A diode laser based high spectral resolution lidar method of analysis comprises:

generate a laser beam, split a laser beam into a first portion and a second portions, generate high energy pulses from the first portion of the laser beam, expand the first portion of the laser beam, transmit the filtered portion of the laser beam, reflect the transmitted laser beam, receive the reflected laser beam; and analyze the reflected laser beam.

Preferably the laser beam is performed using at least one of a distributed Bragg reflector (DBR), or a distributed feedback (DFB) laser.

Preferably the generating high energy pulses is performed using tapered semiconductor optical amplifier.

Preferably the expanding of the laser beam is performed using an axicon pair.

Preferably transmitting the expanded portion of the laser beam is performed using the inner portion of a telescope.

Preferably the receiving the reflected laser beam is performed using the outer portion of a telescope.

Preferably the received reflected laser beam is passed through an interference filter and a narrow band etalon.

Preferably the analysis further comprises passing the reflected laser beam through a heated rubidium vapor cell.

In one aspect of the invention, a diode base high spectral resolution lidar comprises:

a laser emitting a laser beam, a splitter which separates the laser beam, an amplifier which receives a portion of the laser beam, prisms which receive and expand the laser beam; and a telescope which transmits the laser beam.

Preferably the device further comprising:

a device which receives reflected laser light, a filter to receive the reflected laser light, an etalon for receiving the filtered reflected laser light, a device for analyzing the filtered reflected laser light.

Preferably the amplifier comprises a tapered semiconductor optical amplifier.

Preferably the telescope comprises an inner portion that transmits laser light and an outer portion that receives reflected laser light.

Preferably the reflected light is analyzed using at least one of a heated rubidium vapor cell and a depolarization channel.

BRIEF DESCRIPTION OF THE DRAWINGS

FIG. 1 depicts a conceptual schematic of the DLB-HSRL.

DETAILED DESCRIPTION OF THE INVENTION

FIG. 1 and the following description depict specific examples to teach those skilled in the art how to make and use the best mode of the Application. For the purpose of teaching inventive principles, some conventional aspects have been simplified or omitted. Those skilled in the art will appreciate variations from these examples that fall within the scope of the Application. Those skilled in the art will appreciate that the features described below can be combined in various ways to form multiple variations of the Application. As a result, the Application is not limited to the specific examples described below, but only by the claims and their equivalents.

FIG. 1 depicts a conceptual layout of the DLB-HSRL system. The DLB-HSRL uses a distributed Bragg reflector (DBR) 780 nm laser (101) which provides a source with power and frequency stability needed for accurate filtering of molecular and aerosol backscatter in an DLB-HSRL receiver.

A computer operable (118) standard diode laser controller (117) operates the DBR laser (101) at constant temperature. Approximately ten percent of the laser output (102) is sampled and directed to a wavelength meter (103) or rubidium vapor cell to monitor and lock the laser output wavelength.

The remaining ~90 percent of the laser output (104) passes through an inline fiber isolator (105) and thereafter into a tapered semiconductor optical amplifier, hereinafter TSOA (106). The laser source is then amplified by the TSOA (106) to produce a transmitted laser pulse and to achieve high enough output power for daytime operation. The current to the TSOA (106) is modulated to produce an output pulse or output pulse encoding where higher energy pulses are generated based on the current pulses supplied by a current pulser component (119).

The output energy is monitored (107) for later signal processing. The beam is expanded through a pair of axicon prisms (108), then passes through a splitter (121) and a lens (120) to reduce energy lost from the telescope spider (109) and finally transmitted through the inner portion of the telescope (110). This design uses a shared telescope design where the inner portion is dedicated to the transmitter and the outer portion is dedicated to the receiver.

This laser-amplifier combination does not require a cooling unit and occupies a volume that is a fraction of the size of a neodymium-doped yttrium aluminum garnet lasers, also known as Nd:YAG lasers, commonly employed in Raman and HSRL systems. The semiconductor lasers used in the DLB-HSRL are lower cost and longer lifetime than the Nd:YAG. Because these lasers require no cavity alignment, or realignment, or consumables such as flash lamps, they are zero maintenance and are therefore suitable for use in a lidar network. This is a significant contrast to Nd:YAG lasers.

The received light (111) is collected by the outer portion of the telescope and reflected by a mirror (112), a beamsplitter (121), then through an interference filter (113) and a narrow band etalon for reducing background light. An etalon is an optical device which reflects incoming light repeatedly between two or more reflective surfaces. Etalons may serve as a narrow band optical filter by means of interference effects. The light then passes through a beam splitter (114) where part is coupled into the fiber for the total detection channel. The other light passes through a heated rubidium vapor cell (115) which blocks spectrally narrow cloud and aerosol returns, passing only the wings of molecular returns into the fiber for the molecular channel detector (116).

A depolarization channel is not shown in the schematic but is easily added by splitting the light on the total channel with a polarizing beam splitter. Light exiting each port is then directed onto to detectors corresponding to the total parallel and total perpendicular backscatter.

To perform the HSRL technique, a rubidium (Rb) cell of isotropic Rb 87 is heated to approximately 320 K, where the optical depth is sufficient to block strong backscatter from liquid water clouds. Optical depth is a measure of how much light is transmitted through a medium or device. It is the natural logarithm of the ratio of initial to the transmitted optical power and describes the ability of the medium or device to extinguish incident light.

Operation of the laser occurs at 780 nm wavelength, where the D2 line of rubidium is strongly absorbing. This wavelength overlaps with a well-developed line of necessary commercial components such as the DBR lasers (101), TSOA (106) and silicon-based single-photon-counting detectors. These components are available as fiber-coupled devices, an essential ingredient to maintain instrument alignment in an unattended network deployment. Thus, the rubidium filter in the lidar receiver, coupled with a fiber-coupled diode-laser-based transmitter, enables a low-cost and low-maintenance HSRL technique capable of providing quantitative lidar data products.

The detailed descriptions of the above embodiments are not exhaustive descriptions of all embodiments contemplated by the inventors to be within the scope of the Application. Indeed, persons skilled in the art will recognize that certain elements of the above-described embodiments may variously be combined or eliminated to create further embodiments, and such further embodiments fall within the scope and teachings of the Application. It will also be apparent to those of ordinary skill in the art that the above-described embodiments may be combined in whole or in part to create additional embodiments within the scope and teachings of the Application.

The invention claimed is:

1. A device comprising:
a laser (101) emitting a laser beam;
a first splitter (102) which separates the laser beam and generates a first portion of the separated laser beam and a second portion of the separated laser beam;
an amplifier which receives the first portion of the separated laser (101) beam and generates an amplified separated beam;
prisms (108) which receive and expand the amplified separated laser beam and generates an expanded amplified separated laser beam;
a telescope (110) which transmits the expanded amplified separated laser beam and receives a return signal;
a second splitter (114) which splits the return signal into a first return signal portion and a second return signal portion; and
a heated rubidium cell (115) which receives the second return signal portion and generates a molecular return signal,
wherein the first return signal portion comprises a total detection signal.

2. The device of claim 1 further comprising:
a mirror with a hole (121) which reflects the return signal from the telescope;
a filter (113) to receive and filter the return signal; and
an etalon for receiving and filtering the return signal.

3. The device of claim 2 wherein the telescope (110) comprises an inner portion that transmits the expanded amplified separated laser beam and an outer portion that receives the return signal.

4. The device of claim 2, wherein the telescope further comprises an outer portion to receive the return signal, the filter (113) comprises an interference filter, and the device further comprises:
a total detection channel which receives the total detection signal and generates a total detection signal count; and
a molecular channel detector (116) which receives the molecular return signal and generates a molecular return signal count.

5. The device of claim 1 wherein the amplifier comprises a tapered semiconductor optical amplifier.

6. The device of claim 1 further comprising:
a depolarization channel (116) configured to analyze the first return signal portion.

7. The device of claim 1, wherein the laser (101) comprises a diode laser, the amplifier comprises an inline fiber isolator and a tapered semiconductor optical amplifier, the prisms (108) further comprise at least one pair of axicon prisms which form the expanded amplified separated laser beam into an annular shape, and the telescope (110) contains an inner portion through which the laser beam is transmitted.

8. The device of claim 1 wherein the laser (101) uses at least one of a distributed Bragg reflector (DBR), or a distributed feedback (DFB) laser.

9. The device of claim 1 wherein the laser (101) has a wavelength of approximately 780 nanometers.

10. The device of claim 1 wherein second portion of the separated laser beam is directed to at least one of a wavelength meter or a device for monitoring and controlling the wavelength of the laser.

11. A method of analysis comprising:
generating a laser beam using a laser;
splitting the laser beam into a first portion of the separated laser beam and a second portion of the separated laser beam using a first splitter;
generating high energy pulses from the first portion of the laser beam using an amplifier which receives the first portion of the separated laser beam and generates an amplified separated beam;
expanding the first portion of the laser beam using prisms which receive and expand the amplified separated laser beam and generates an expanded amplified separated laser beam;
transmitting the expanded amplified separated laser beam using a telescope;

receiving a return signal via the telescope;
splitting the return signal into a first return signal portion and a second return signal portion using a second splitter; and
generating a molecular return signal from the second return signal portion using a heated rubidium cell,
wherein the first return signal portion comprises a total detection signal.

12. The method of claim 11 wherein the laser is at least one of a distributed Bragg reflector (DBR), or a distributed feedback (DFB) laser.

13. The method of claim 11 wherein the amplifier is a tapered semiconductor optical amplifier.

14. The method of claim 11 wherein the prisms comprise an axicon pair.

15. The method of claim 11 wherein the transmitting the expanded amplified separated laser beam comprises using an inter portion of the telescope.

16. The method of claim 11 further comprising:
receiving return signal via an outer portion of a telescope.

17. The method of claim 16 further comprising:
filtering the return signal via an interference filter and a narrow band etalon.

* * * * *